United States Patent
Sun et al.

(10) Patent No.: US 7,635,654 B2
(45) Date of Patent: Dec. 22, 2009

(54) MAGNETIC TUNNEL JUNCTION DEVICE WITH IMPROVED BARRIER LAYER

(75) Inventors: JiJun Sun, Chandler, AZ (US); John T. Martin, Chandler, AZ (US); Jon M. Slaughter, Tempe, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 441 days.

(21) Appl. No.: 11/341,986

(22) Filed: Jan. 27, 2006

(65) Prior Publication Data

US 2007/0178608 A1 Aug. 2, 2007

(51) Int. Cl.
 *H01L 21/316* (2006.01)
 *H01L 27/115* (2006.01)

(52) U.S. Cl. ............... 438/768; 438/765; 257/E21.28; 360/324.2; 365/158

(58) Field of Classification Search .......... 438/3, 438/264, 622, 263, 172, 483, 765, 768, 799; 360/324.2; 365/158, 171, 173; 338/32 R; 257/421, E21.28, E21.29, E21.665
 See application file for complete search history.

(56) References Cited

U.S. PATENT DOCUMENTS

| | | | |
|---|---|---|---|
| 6,215,696 B1 * | 4/2001 | Tsuge | 365/173 |
| 6,219,274 B1 * | 4/2001 | Shimazawa et al. | 365/158 |
| 6,574,079 B2 * | 6/2003 | Sun et al. | 360/324.2 |
| 6,710,987 B2 * | 3/2004 | Sun et al. | 360/324.2 |
| 6,801,415 B2 | 10/2004 | Sun et al. | |
| 6,841,395 B2 | 1/2005 | Linn et al. | |
| 6,903,400 B2 * | 6/2005 | Kikuchi et al. | 257/295 |
| 7,061,034 B2 * | 6/2006 | Park et al. | 257/294 |
| 2005/0260772 A1 * | 11/2005 | Horng et al. | 438/3 |
| 2007/0171694 A1 * | 7/2007 | Huai et al. | 365/145 |

* cited by examiner

*Primary Examiner*—W. David Coleman
*Assistant Examiner*—Maliheh Malek
(74) *Attorney, Agent, or Firm*—Ingrassia, Fisher & Lorenz, P.C.

(57) ABSTRACT

Methods and apparatus are provided for magnetic tunnel junction (MTJ) devices and arrays, comprising metal-insulator-metal (M-I-M) structures with opposed first and second ferro-magnetic electrodes with alterable relative magnetization direction. The insulator is formed by depositing an oxidizable material (e.g., Al) on the first electrode, naturally oxidizing it, e.g., at about 0.03 to 10 milli-Torr for up to a few thousand seconds at temperatures below about 35° C., then further rapidly (e.g., plasma) oxidizing at a rate much larger than that of the initial natural oxidation. The second electrode of the M-I-M structure is formed on this oxide. More uniform tunneling properties result. A second oxidizable material layer is optionally provided after the initial natural oxidation and before the rapid oxidation step during which it is substantially entirely converted to insulating oxide. A second natural oxidation cycle may be optionally provided before the second layer is rapidly oxidized.

20 Claims, 6 Drawing Sheets

MAGNETIC TUNNEL JUNCTION DEVICE WITH IMPROVED BARRIER LAYER

TECHNICAL FIELD

The present invention generally relates to magnetoelectronic devices, and more particularly relates to magnetic tunnel junction devices and methods for fabricating magnetic tunnel junction (MTJ) devices.

BACKGROUND

Magnetoelectronics devices, spin electronics devices, and spintronics devices are synonymous terms for devices that use the effects predominantly caused by electron spin. Magnetoelectronics effects are used in numerous information devices, and provide non-volatile, reliable, radiation resistant, and high-density data storage and retrieval. The numerous magnetoelectronics information devices include, but are not limited to, magnetic random access memory (MRAM), magnetic sensors, and read/write heads for disk drives.

Typically, a magnetoelectronic device, such as a magnetic memory element, has a structure that includes multiple ferromagnetic layers separated by at least one non-magnetic layer. In the magnetic memory element, information is stored as directions of magnetization vectors in the magnetic layers. Magnetization vectors in one magnetic layer, for instance, are magnetically fixed or pinned, while the magnetization direction of the other magnetic layer is free to switch between the same and opposite directions that are called "parallel" and "antiparallel", respectively, and other directions or states. In response to parallel and antiparallel states, and in certain instances other states, the magnetic memory element represents different resistances. The resistance can have minimum and maximum values when the magnetization vectors of the two magnetic layers point in substantially the same and opposite directions, respectively. Accordingly, a detection of change in resistance allows a device, such as an MRAM device, to provide information stored in the magnetic memory element. The difference between the minimum and maximum resistance values divided by the minimum resistance is known as the magnetoresistance ratio (MR).

One type of magnetic memory element, a magnetic tunnel junction (MTJ) element, comprises a fixed ferromagnetic layer that has a magnetization direction fixed with respect to an external magnetic field and a free ferromagnetic layer that has a magnetization direction that is free to rotate with the external magnetic field. The fixed layer and free layer are separated by an insulating tunnel barrier layer that relies upon the phenomenon of spin-polarized electron tunneling through the tunnel barrier layer between the free and fixed ferromagnetic layers. The tunneling phenomenon is electron spin dependent, making the electrical response of the MTJ element or device a function of the relative orientations and spin polarization of the conduction electrons between the free and fixed ferromagnetic layer.

FIG. 1 is a simplified schematic diagram of test circuit 30 for exemplary MTJ device 31. Magnetic tunnel junction device 31 comprises metal-insulator-metal (M-I-M) sandwich 32 and magnetic field source 34. M-I-M sandwich or structure 32 comprises lower electrode 36 of a ferro-magnetic material (e.g., CoFeB), upper electrode 38 of another ferromagnetic material (e.g., NiFe) separated by very thin dielectric 37 through which tunneling current $I_t$ can flow in response to voltage $V_t$ applied across electrodes 36, 38. Resistor $R_o$ is provided in series with MTJ 31 so that the electrical response $I_t$ of M-I-M structure 32 and MTJ 31 to applied voltage $V_t$ can be measured. The ratio $V_t/I_t$ defines the resistance $R_t$ of M-I-M structure 32 and MTJ 31. In general, $I_t$ and $R_t$ are non-linear functions of $V_t$. Arrows 40, 42 indicate the magnetization direction, in electrodes 36, 38, which can be set in particular directions. In an exemplary implementation, the material of electrode 36 is chosen so that magnetization direction 40 is fixed and the material of electrode 38 is chosen so that magnetization direction 42 is free, that is, it can be varied so as to be parallel or anti-parallel or otherwise to magnetization direction 40. This change in magnetization direction 42 is caused, for example and not intended to be limiting, by current $I_m$ passing through nearby conductor 34 whose magnetic field 35 intercepts at least electrode 38. By sending a current pulse $I_m$ through conductor 34, magnetization direction 42 can be flipped from one orientation to another relative to magnetization direction 40, and will remain in such orientation until a different current pulse is provided. $R_t$ depends upon the relative orientation of magnetization directions 40, 42 and, other things being equal, $R_t$ can have different values depending upon relative orientations of magnetization directions 40, 42. Thus, MTJ device 31 can function as a non-volatile memory or a measuring element whose state is detected by measuring $R_t$.

Tunnel barrier layer 37 of M-I-M structure 32 is important to the performance of MTJ element 31, as the MR is strongly dependent on the tunnel barrier quality. Furthermore, because future generations of magnetoelectronic devices, such as MRAMs and others, may be scaled to smaller sizes, thinner tunnel barrier layers will be desired. MTJ devices, such as MRAMs, inherently employ very large electric fields across very thin insulating dielectric layers 37. Generally, it is very hard to make such MTJs with uniform, predictable and stable values of resistance $R_t$. The variations in $R_t$ among nominally identical structures and the variations in the stability of $R_t$ values with time even among substantially identical structures, are significant limitations of MTJ devices, especially when such devices are used in large arrays containing, perhaps, millions of individual MTJ devices. Thus, there is an ongoing need to provide MTJ devices of improved properties.

Accordingly, it is desirable to provide MTJ devices having, among other things, more uniform, predictable and stable properties. In addition, it is desirable that the methods, materials and structures employed be compatible with present day manufacturing capabilities and materials and not require substantial modifications of manufacturing procedures or substantially increase manufacturing costs. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

Figure 1:
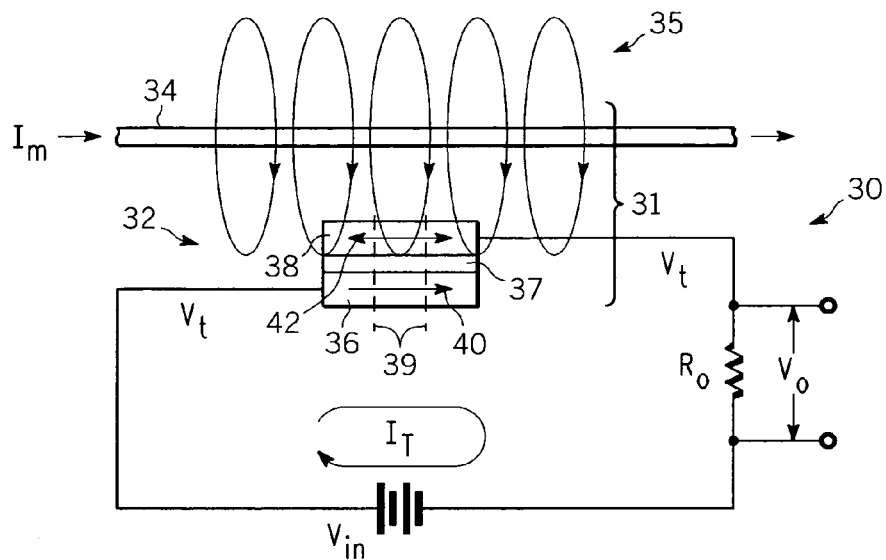
FIG. 1 is a simplified schematic electrical measuring circuit for an MTJ device, incorporating a M-I-M tunnel sandwich structure seen in side view.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "front," "back," "up," "down," "top," "bottom," "over," "under," "above," "below" and the like in the description and the claims, if any, are used for describing relative positions and not necessarily for describing permanent positions in space. It is to be understood that the embodiments of the invention described herein are, for example, capable of operation in other orientations than those illustrated or otherwise described herein. The term "coupled," as used herein, is defined as directly or indirectly connected in an electrical or non-electrical manner. The terms "insulator" and "insulating" and "dielectric" are used interchangeably herein. For convenience of description, the acronym MRAM for magnetic random access memory, is used herein to include any large array of MTJ devices, irrespective of their particular organization, that is, whether random access, content addressable, FIFO and so forth. The present invention is useful for MTJ memory arrays organized in any way and is not intended to be limited merely to random access arrays. The term "array" or "arrays" with respect to MTJ devices is intended to include collections of MTJ devices used for any purpose.

Fabrication of high quality MTJ tunnel barriers is critical to successful manufacture of MTJ device, such as MRAMs and other functions. The insulating layers used in such MTJ devices are ordinarily only a few atomic layers thick. Hence, it is extremely important that such insulating layers be very uniform and defect and pin-hole free. At the same time, the process for fabricating such tunnel barriers for MTJs must be relatively simple, be amenable to mass fabrication techniques and not involve inordinate amounts of time, so that the overall manufacturing process is practical and of low cost. In MRAMs employing MTJs, the occurrence of bits (e.g., individual MTJ devices) with low resistance is one of the largest issues for manufacturability yield and thus cost. Low resistance includes both hard shorts and partial shorts. In general, $R_t$ values of MTJ devices that are nominally identical, follows a Gaussian distribution. Hard shorts refer to bits (e.g., MTJ devices) whose resistance $R_t$ is much lower than what would be expected from the normal Gaussian distribution of bit resistances, and whose MR is very low compared to the means or average values of MR observed for such devices. Partial shorts refer to bits (e.g., MTJ devices) whose resistance $R_t$ lies outside the normal Gaussian distribution, but which otherwise function normally, that is, which can be repeatedly written and erased by change magnetization direction. Accordingly, for the purpose of comparing various manufacturing techniques for fabricating tunneling barriers in MTJs devices a partial short is defined at the wafer probe stage of manufacturing of an MTJ MRAM or other array as either: (i) any bit whose resistance $R_t$ lies below the 6-sigma level of the normal Gaussian distribution of $R_t$ values, or (ii) any bit whose magneto-resistance ratio (MR) falls below the 6-sigma level of the Gaussian distribution of the MRs, where $MR=(R_{tmax}-R_{tmin})/R_{tmin}$, where $R_{tax}$ is the $R_t$ value of the high resistance state of the bit and $R_{tmin}$ is the $R_t$ value for the low resistance state of the bit at, for example, constant voltage $V_t$. Partial shorts are a good indicator of insulator integrity of the tunnel barrier. The better the insulator integrity and uniformity, the narrower the MTJ resistance distribution and the lower the incidence of partial shorts. Variations in MR may or may not be caused by insulator defects since the MR, while an important criteria for overall MRAM and other MTJ array performance, is also dependent upon the magnetic state of layers 36, 38 that make up the electrodes of the MTJ device and not merely on the integrity of insulator 37 alone.

Figure 2:
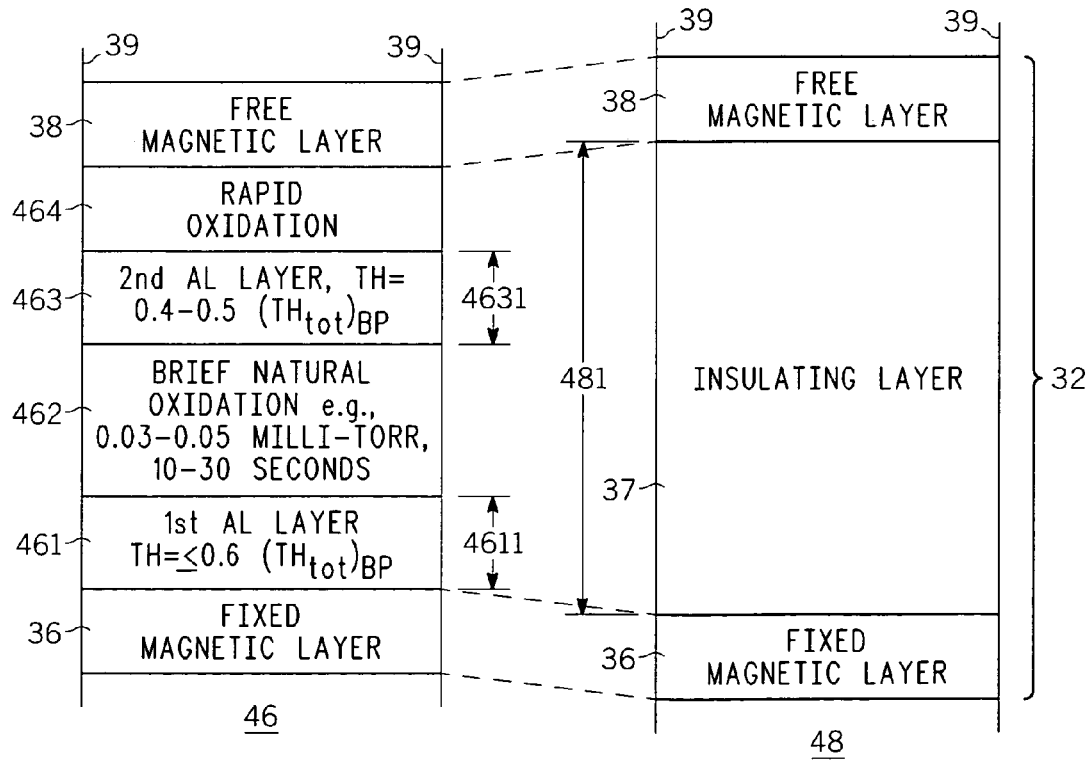
FIGS. 2-5 are simplified side views of a vertical slice through an MTJ sandwich analogous to that shown in FIG. 1, illustrating how the MTJ is formed according to different embodiments of the present invention.

FIGS. 2-5 are simplified side view 46-48; 56-58; 66-68; 76-78 of vertical slice 39 through an M-I-M sandwich analogous to M-I-M sandwich 32 of MTJ 31 shown in FIG. 1, illustrating how the M-I-M sandwich is formed according to different embodiments of the present invention. Referring now to FIG. 2, vertical slice 46 illustrates how various regions and steps 461-464 are used to build up what eventually forms insulator 37 of slice 48 of M-I-M sandwich 32, according to a first embodiment of the present invention referred to as the "base process," abbreviated as "BP" or (BP). First oxidizable layer 461 (e.g., of Al) having a thickness 4611 of about less than about 60% of the total oxidizable layer thickness $(TH_{tot})_{BP}$ used to form insulator 37 is provided over fixed magnetic layer 36, with about 50-60% being preferred. The total oxidizable layer thickness for the base process $(TH_{tot})_{BP}$ is the sum of the thickness 4611 of layer 461 plus thickness 4631 of layer 463 prior to the oxidation steps. Layer 461 (and layer 463) can be formed by any suitable deposition process, such as, for example, ion beam deposition, physical vapor deposition (PVD), molecular beam epitaxy (MBE), and the like. Aluminum is the preferred material for layer 461 (and for layer 463) because it can be readily converted to aluminum oxide, which is an excellent tunneling barrier, well suited for use in MTJ devices. However, other metals that form thin, self-sealing insulating oxides can also be used, such as, one or more of Al, Mg, Zr, Ti, Hf, Ta or combinations thereof. In step 462, layer 461 is exposed to brief so-called "natural" oxidation in pure oxygen or oxygen mixture with another gases at a pressure of about or less than about 0.03 to 0.05 milli-Torr for about very short time, a few tens of seconds (e.g., 10-30 second), at temperatures less than about 35° C. Oxidation at about less than about 35° C. is referred to as "low temperature" or "natural" oxidation because it resembles in speed and self-limiting behavior the oxidation that occurs on simple exposure to air at ordinary (e.g., "room") temperatures. This causes a small portion of first Al layer 461 to be slowly converted to aluminum oxide, as for example, $Al_2O_3$, but intermediate oxides $Al_xO_y$ may also be present. This is believed to form a particularly dense and pin-hole free oxide, albeit very slowly and of limited thickness, since oxide growth is limited by the rate at which Al and/or oxygen ions can diffuse through the growing oxide film. The thicker the oxide film, the slower the growth. The growth rate declines very quickly with increase oxide film thickness. Following natural oxidation step 462, second layer 463 of aluminum or other metal with analogous oxidation properties having a thickness 4631 in the range of 40% to 50% of the total oxidizable layer thickness used to form insulator 37 is then deposited over oxidized layer 461 in the same manner as used to form layer 461. A thickness for layer 462 of about 40% of the total oxidizable layer thickness $(TH_{tot})_{BP}$ is preferred. $(TH_{tot})_{BP}$ is usefully in the range of about 5-15 Angstrom units, conveniently about 6-10 Angstrom units and preferably about 7-9 Angstrom units for aluminum or thickness equivalent materials. Persons of skill in the art will understand that the thickness of the oxidizable layer(s) may need to be adjusted slightly for other oxidizable materials besides aluminum to take into account the change in the volume ratio of the resulting oxide compared to the initial metal layer, which occurs with different materials. Accordingly, the thicknesses given herein for the oxidizable material in this and other embodiment of the present invention should be considered as being in aluminum equivalent units.

In step 464, second oxidizable layer 463 is then exposed to rapid oxidation. As used herein, the term "rapid oxidation" is defined as oxidation that proceeds much more rapidly than natural oxidation, that is, at least about twice the rate of natural oxidation, more conveniently at least about ten times the rate of natural oxidation and preferably at least about a hundred times the rate of natural oxidation, for the same oxide thicknesses. Rapid oxidation is desirable because the time duration to reach desirable insulator thickness values is too long for practical manufacturing when only low temperature, natural oxidation is used. Also due to the self-limitation of oxidation, the layer can not be fully oxidized in any reasonable time by only natural oxidation when the oxidizable material thickness is over the certain range. Any one of a number of accelerated oxidation techniques can be used. Non-limiting examples are higher temperature thermal oxidation, high pressure oxidation, anodic oxidation and plasma oxidation. Plasma oxidation is preferred. Plasma oxidation is a well known technique. Useful forms of plasma oxidation are: ion beam oxidation, remote plasma oxidation, radical or atomic oxidation, substrate RF plasma oxidation and so on. The plasma excites the oxygen ions so that oxidation of second layer 463 (and any remainder of first layer 461) is much accelerated compared to natural oxidation. This is because the excited oxygen ions have much higher energy than those participating in low temperature, "natural" oxidation and therefore can migrate more rapidly through the growing oxide layer. By way of example and not intended to be limiting, plasma oxidation can be usefully carried out at 1-50 milli-Torr using pure oxygen or oxygen mixtures such as 2-50% oxygen in argon or nitrogen. An RF plasma generator operating at 13.56 Mega-Hertz at 50-200 Watts is a suitable energy source for generating the plasma, but many other well known energy sources and can also be used at the same or other gas pressures. What is important in the preferred method is that the plasma provides the desired rapid oxidation without introducing any undesirable contaminants in resulting dielectric layer 37. Oxidizable layers 461, 463 can be substantially consumed by oxidation steps 462, 464. The insulating oxide so formed provides insulating layer 37 of slice 48. Free magnetic layer 38 is then formed over insulating layer 37 so that the structure of slice 48 and M-I-M structure 32 of MTJ 31 is obtained. Thickness 481 of insulating layer 37 is larger than the sum of the initial thicknesses of first and second layers 461, 463 because of the incorporated oxygen atoms.

Figure 3:
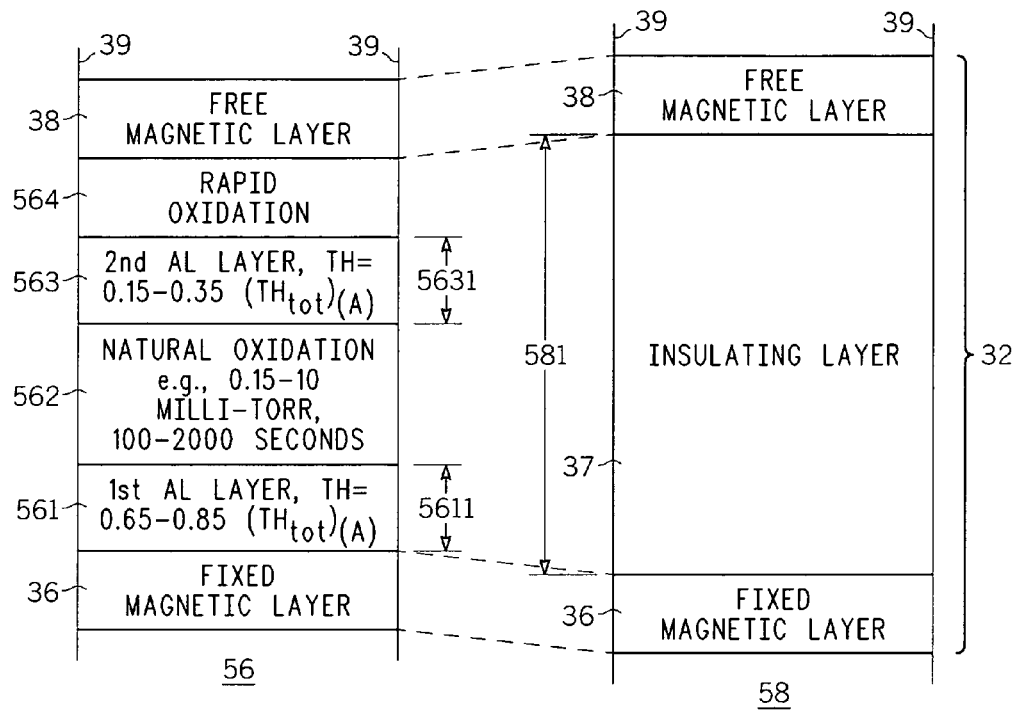

Referring now to FIG. 3, vertical slice 56 illustrates how various regions and steps 561-564 are used to build up what eventually forms tunnel barrier 37 of slice 58 of M-I-M structure 32 of MTJ 31, according to another embodiment of the present invention referred to as "improved process (A)." Since the structure and steps illustrated in slice 56 of FIG. 3 and in slice 46 of FIG. 2 differ only in the thickness of layers 561, 563 compared to layers 461, 463 and in oxidation step 562 compared to oxidation step 462, the description of FIG. 3 is more abbreviated, and the remaining discussion of FIG. 2 is incorporated herein by reference. The total oxidizable material thickness for process (A), identified herein as $(TH_{tot})_{(A)}$, is the sum of thickness 5611 of first oxidizable layer 561 and thickness 5631 of second oxidizable layer 563. First oxidizable layer 561 (e.g., of Al) having thickness 5611 in the range of 65% to 85% of $(TH_{tot})_{(A)}$, is provided over fixed magnetic layer 36 in the same manner as has been described for layer 461. Thicknesses 5611 of about 72% of $(TH_{tot})_{(A)}$, is preferred when Al is used. In step 562, layer 561 is exposed to so-called "natural" oxidation in oxygen or oxygen mixture, such as 2-80% oxygen in nitrogen, at a relative high pressure (compared to BP) of about 0.15 to 10 milli-Torr for relative long duration (compared to BP) up to about a few thousand seconds, preferably about 100-2000 seconds, at temperatures less than about 35° C., also referred to herein as "low" temperature or "natural" oxidation. This causes a portion of first oxidizable layer 561 (e.g., of Al) to be slowly converted to oxide, for example $Al_2O_3$, but intermediate oxides $Al_xO_y$ may also be present. Furthermore, due to this longer natural oxidation process, the defects and Al non-uniformity arising from Al deposition can be reduced. Following natural oxidation step 562, second layer 563 of aluminum (or other metal with analogous oxidation properties) having thickness 5631 in the range of about 15% to 35% of $(TH_{tot})_{(A)}$, is then deposited over oxidized layer 561 in the same manner used to form layer 561, with about 28% being preferred. $(TH_{tot})_{(A)}$ is usefully in the range of about 5-15 Angstrom units, conveniently about 6-10 Angstrom units and preferably about 7-9 Angstrom units for aluminum or thickness equivalent materials. In step 564, second oxidizable layer 563 is then exposed to rapid oxidation, substantially as discussed in connection with FIG. 2. Rapid oxidation is desirable because the time duration to reach desirable insulator thickness values is too long for practical manufacturing when only low temperature, natural oxidation is used. Oxidizable layers 561, 563 can be substantially consumed by oxidation steps 562, 564. The resulting oxide, provides insulating layer 37 of slice 58. Free magnetic layer 38 is then formed over insulating layer 37 so that the structure of slice 58 and M-I-M structure 32 of MTJ 31 is obtained. Thickness 581 of resulting insulating layer 37 is larger than the sum of the initial thicknesses of first and second layers 561, 563 because of the incorporated oxygen atoms. While Al is a preferred material for oxidizable layers 561, 563, other materials such as one or more of Al, Mg, Zr, Ti, Hf, Ta and combinations thereof can also be used.

Figure 4:
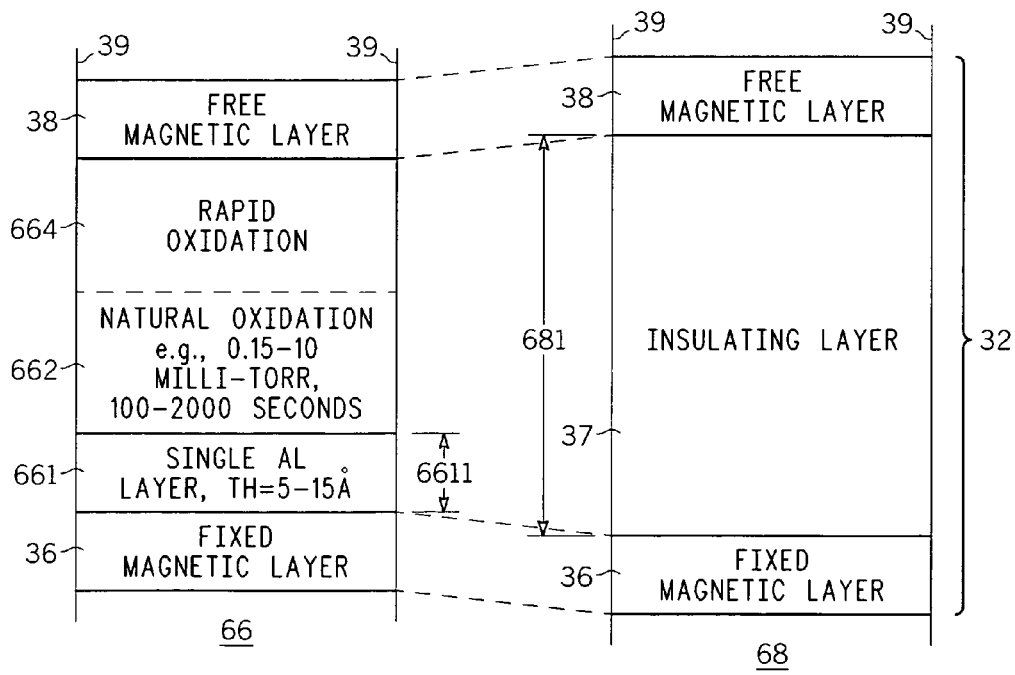

Referring now to FIG. 4, vertical slice 66 illustrates how various regions and steps 661-664 are used to build up what eventually forms insulator 37 of slice 68 of M-I-M structure 32 of MTJ 31, according to still another embodiment of the present invention referred to as "improved process (B)." Single oxidizable layer 661 (e.g., of aluminum) having thickness 6611, also referred to as $TH_{(B)}$, usefully in the range of about 5-15 Angstrom units, more conveniently about 6-10 Angstrom units and preferably about 7-9 Angstrom units is applied over fixed magnetic layer 36 in the same manner as described for layer 461. Aluminum is preferred but other materials that form self sealing oxides and other thicknesses, may also be used depending upon the final thickness desired for insulator 37, taking into account any differences in the metal to oxide volume ratio compared to aluminum. In step 662, layer 661 is exposed to so-called "natural" oxidation in oxygen or oxygen mixtures, such as 2-80% oxygen in nitrogen at a pressure of about, for example, about 0.15 to 10 milli-Torr for a duration up to a few thousand seconds at temperatures less than about 35° C., i.e., "low temperature" or "natural oxidation." Oxidation times of 100-2000 seconds are preferred. These conditions are substantially the same natural oxidation conditions as described in connection with step 562 of FIG. 3. This causes a portion of first oxidizable layer 661 to be slowly converted to an insulating oxide, for example, $Al_2O_3$, but intermediate oxides $Al_xO_y$ may also be present. $Al_xO_y$ is believed to form a particularly dense and pin-hole free oxide, albeit very slowly and of limited thickness, since oxide growth is limited by the rate at which Al and/or oxygen ions can diffuse through the growing oxide film. Following natural oxidation step 662, rapid oxidation step 664 is performed, substantially as discussed in connection with step 464 of FIG. 2, which discussion is incorporated herein by reference. Oxidizable layer 661 can be substantially consumed by oxidation steps 662, 664. The resulting oxide provides insulating layer 37 of slice 68. Free magnetic layer 38 is then formed over insulating layer 37 so that the structure of slice 68 and M-I-M structure 32 of MTJ 31 is obtained. Thickness 681 of insulating layer 37 is generally larger than the initial thicknesses of single oxidizable layer 661 because of the incorporated oxygen atoms. While Al is a preferred material for oxidizable layer 661, other materials such as one or more of Al, Mg, Zr, Ti, Hf, Ta and combinations thereof can also be used.

Figure 5:
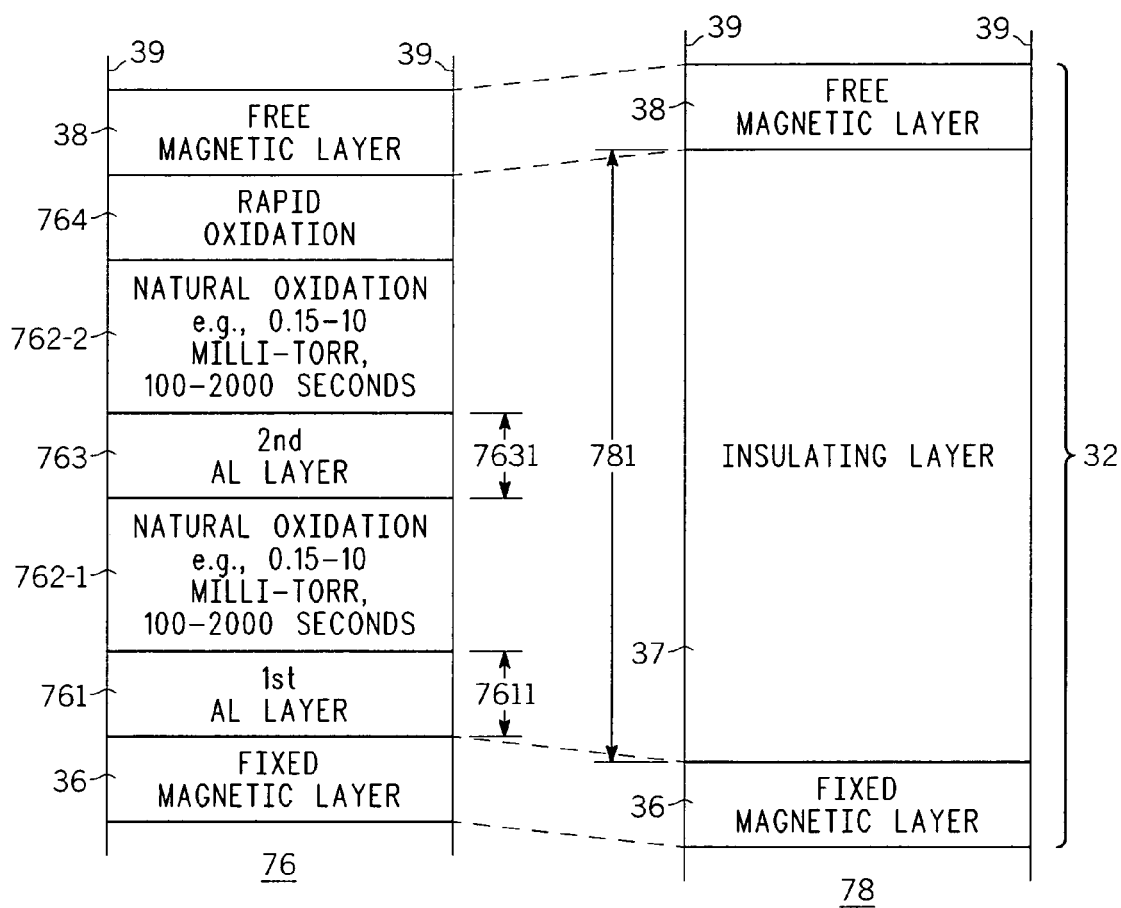

Referring now to FIG. 5, vertical slice 76 illustrates how various regions and steps 761-764 are used to build up what eventually forms insulator 37 of slice 78 of M-I-M structure 32 of MTJ 31, according to yet still another embodiment of the present invention referred to as "improved process (C)." First oxidizable layer 761 of, e.g., aluminum or other oxidizable material, and having thickness 7611 similar to thickness 5611 of layer 561 of FIG. 3, is applied in the same manner as has already been described in connection with FIGS. 2-4 over fixed magnetic layer 36 and then exposed in step 762-1 to "natural" oxidation as already described in connection with steps 562, 662 of FIGS. 3-4. Step 762-1 causes a portion of first oxidizable layer 761 to be slowly converted to insulating oxide, for example, $Al_2O_3$, but intermediate oxides $Al_xO_y$ may also be present, as has already been described. Following natural oxidation step 762-1, second oxidizable layer 763 having thickness 7631 similar to thickness 5631 of layer 563 of FIG. 3, is then deposited using substantially the same methods as have already been described, over oxidized layer 761. The sum of thickness 7611 and 7631 is referred to as $(TH_{tot})_{(C)}$. In step 762-2. second oxidizable layer 763 is then preferably exposed to a further natural oxidation cycle under substantially the same conditions as in step 762-1, although other low temperature oxidation cycles can also be used. Step 762-2 oxidizes second oxidizable layer 763 in the same manner as has already been discussed for natural oxidation of layer 761. Following step 762-2, then in step 764, oxidized second oxidizable layer 763 is exposed to rapid oxidation, substantially as discussed in connection with step 464 of FIG. 2, the discussion of which is incorporate herein by reference. Oxidizable layers 761, 763 can be substantially consumed by oxidation steps 762-1, 762-2, 764. The resulting oxide provides insulating layer 37 of slice 78. Free magnetic layer 38 is then formed over insulating layer 37 so that the structure of slice 78 is obtained of M-I-M structure 32 of MTJ 31. Thickness 781 of insulating layer 37 is larger than the sum of the initial thicknesses of first and second oxidizable layers 761, 763 because of the incorporated oxygen atoms. While Al is a preferred material for oxidizable layers 761, 763 other materials such as one or more of Al, Mg, Zr, Ti, Hf, Ta and combinations thereof can also be used.

Figure 6:
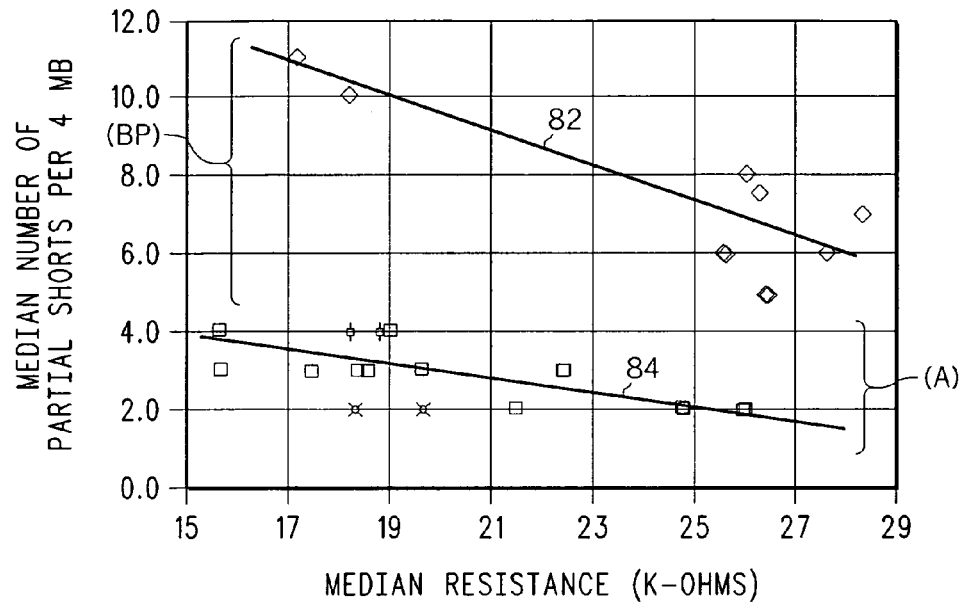
FIGS. 6-7 are experimental results for different MTJs fabricated according to the different methods illustrated schematically in FIGS. 2-5.
Figure 7:
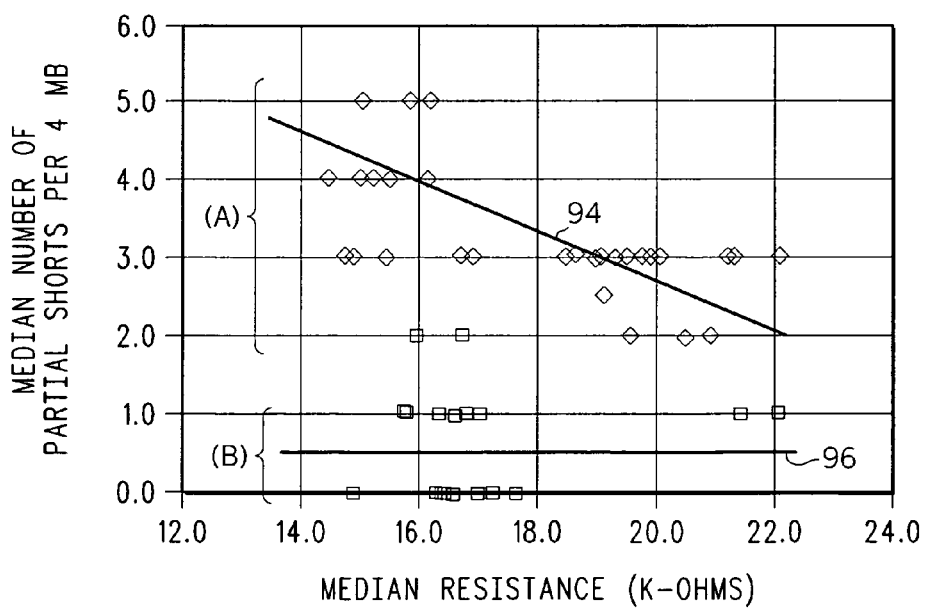

FIGS. 6-7 show plots 80 and 90 of experimental results for different M-I-M sandwiches and MTJs fabricated according to the different methods illustrated schematically in FIGS. 2-5 using aluminum as the oxidizable material. The ordinates of plots 80, 90 are the mean number (abbreviated in the FIGS. 6-7) as "#") of partial shorts in various 4 mega-bit MRAMS and the abscissa is the median MTJ device (i.e., M-I-M sandwich) tunneling resistance $R_{tm}$. These data reflect results obtained using the different processes, that is, the base process (BP) of FIG. 2, process (A) of FIG. 3 and process (B) of FIG. 4. These data were obtained by probing wafers containing MRAM arrays of MTJ devices and measuring $R_t$ at constant voltage. In plot 80 of FIG. 6, the base process (BP) of FIG. 2 (summarized by line 82) is compared to improved process (A) of FIG. 3 (summarized by line 84). It will be apparent that improved process (A) provides significantly fewer defects (partial shorts) than the base process (BP). In plot 90 of FIG. 7, process (A) of FIG. 3 (summarized by line 94) is compared to process (B) of FIG. 4 (summarized by line 96). It will be apparent that improved process (B) provides significant further improvement over process (A), which is already much better than the baseline process (BP). Results for process (C) of FIG. 5 are not shown in FIGS. 6-7, but while better than the base process (BP) and process (A), they were not, in general, better than process (B). Process (C) is a more complex process than process (B) since it uses one more natural oxidation step. A further advantage of process (B) is that it uses only one oxidizable layer rather than two as in the other process versions. Other things being equal, improved process (B) is inherently of lower cost than processes (BP), (A), and (C). Accordingly, improved process (B) is preferred.

Figure 8:
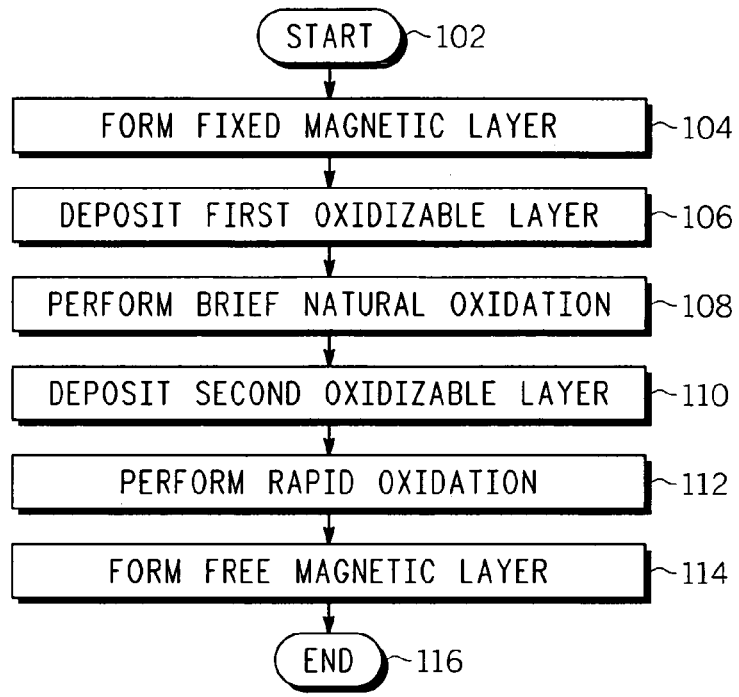
FIGS. 8-11 are simplified process flow charts illustrating methods for forming MTJs, corresponding to FIGS. 2-5.

FIGS. 8-11 are simplified process flow charts illustrating methods 100, 200, 300 and 400 for forming M-I-M structure for MTJs, corresponding to FIGS. 2-5. Referring now to FIGS. 2 and 8, method 100 of FIG. 8 begins with START 102 and initial step 104 wherein fixed ferro-magnetic magnetic layer 36 is formed on a suitable substrate by any convenient deposition technique, such as for example but not limited to, ion beam deposition, physical vapor deposition (PVD), molecular beam epitaxy (MBE), and the like. Layer 36 is magnetically treated to orient and fix its magnetization alignment 40 in a predetermined direction. The present invention does not depend upon the manner of formation of layer 36 and magnetization alignment 40. In step 106, first oxidizable material layer 461 is deposited, by ion beam deposition, physical vapor deposition (PVD), molecular beam epitaxy (MBE), or other convenient techniques well known in the art, to a thickness in the range already described in connection with layer 461 of FIG. 2. In subsequent step 108 corresponding to step 462 of FIG. 2, layer 461 is subjected to a brief natural oxidation as has already been described in connection with step 462 of FIG. 2. Following natural oxidation step 108, then second oxidizable material layer 463 is deposited or otherwise formed over oxidized layer 461 to thickness in the range described in connection with layer 463 of FIG. 2. Following step 110, then in step 112 analogous to step 464 of FIG. 2, layer 463 is subjected to rapid oxidation as described in connection with step 464 of FIG. 2. It is desirable that rapid oxidation step 112 be performed long enough to substantially convert layer 463 to insulating oxide. It also contributes to further conversion of unoxidized material of layer 461 to insulating oxide. The combination of oxidation steps 108, 112 forms insulating layer 37 of M-I-M sandwich 32 of MTJ 31 of FIG. 1, on which in step 114, ferro-magnetic layer 38 of, for example NiFe or other ferro-magnetic alloys, is deposited or otherwise formed, in such a way that magnetization direction 42 can be modified relative to magnetization direction 40 of layer 36. The present invention does not depend upon the exact means by which layer 38 is formed, so long as it is a conductive electrode for carrying tunneling current $I_t$ passing through thin insulating layer 37. After step 114, M-I-M structure 32 of MTJ 31 is substantially complete and method 100 generally goes to END 116.

Figure 9:
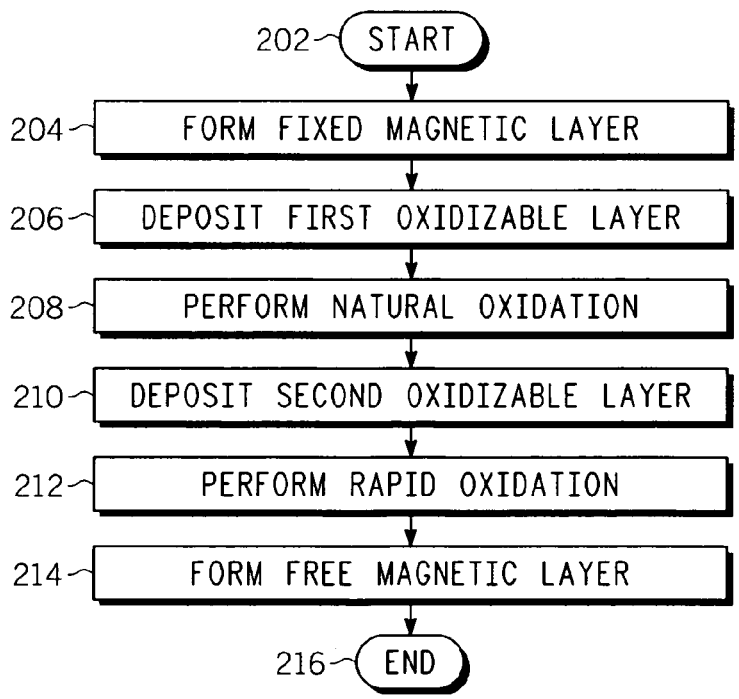

Referring now to FIGS. 3 and 9, method 200 of FIG. 9 begins with START 202 and initial step 204 analogous to step 104 of method 100, wherein fixed ferro-magnetic magnetic layer 36 is formed by any convenient technique, as has already been described in connection with step 104. In step 206, first oxidizable material layer 561 is deposited, preferably by the same technique described in connection with step 106 of FIG. 8, to a thickness in the range described for layer 561 of FIG. 3. In subsequent step 208 corresponding to step 562 of FIG. 3, layer 561 is subjected to natural oxidation as has already been described in connection with step 562 of FIG. 3. Following natural oxidation step 208, then second oxidizable material layer 563 is deposited or otherwise formed over partially oxidized layer 561 to thickness in the range described for layer 563 in FIG. 3. Following step 210, then in step 212 analogous to step 564 of FIG. 3, layer 563 is subjected to rapid oxidation as described in connection with steps 464 of FIG. 2 and 564 of FIG. 3. It is desirable that rapid oxidation step 212 be performed long enough to substantially convert layer 563 to insulating oxide. It also contributes to further conversion of unoxidized material of partially oxidized layer 561 to insulating oxide. The combination of oxidation steps 208, 212 forms insulating layer 37 of M-I-M sandwich 32 of MTJ 31 of FIG. 1, on which in step 214, ferro-magnetic layer 38 of, for example NiFe or other ferro-magnetic alloys, is deposited or otherwise formed, in such a way that magnetization direction 42 can be modified relative to magnetization direction 40 of layer 36. The present invention does not depend upon the exact means by which layer 38 is formed, so long as it is a conductive electrode for carrying tunneling current $I_t$ passing through thin insulating layer 37. After step 214, M-I-M structure 32 of MTJ 31 is substantially complete and method 200 generally goes to END 216.

Figure 10:
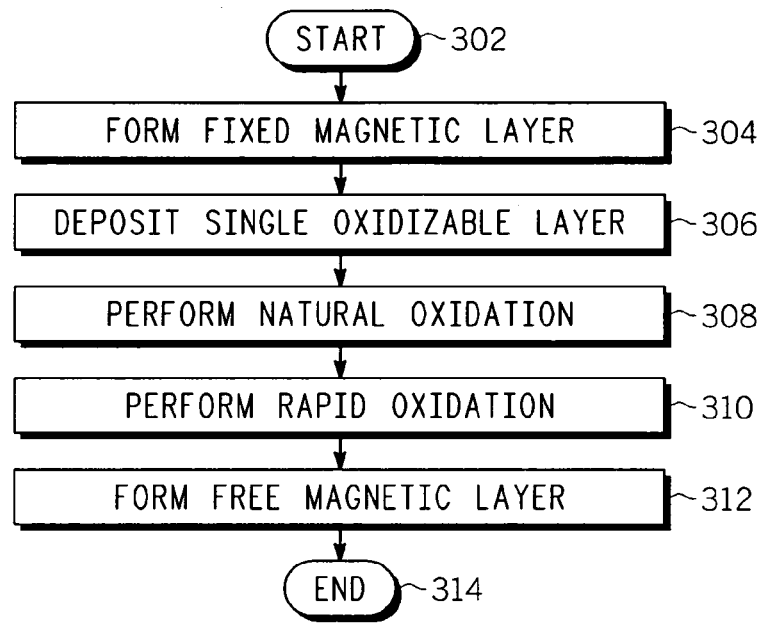
Figure 11:
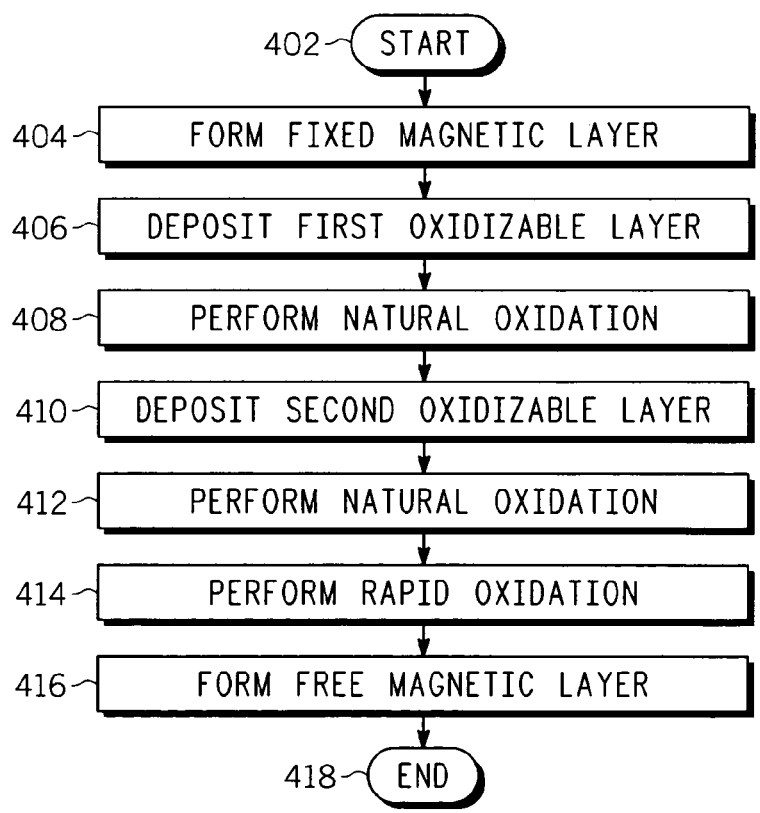

Referring now to FIGS. 4 and 10, method 300 of FIG. 10 begins with START 302 and initial step 304 analogous to step 104 of method 100, wherein fixed spin alignment ferro-magnetic magnetic layer 36 is formed by any convenient technique, as has already been described in connection with step 104. In step 306, single oxidizable material layer 661 is deposited, preferably by the same techniques already described for layers 461, 561 and to thickness in the range described for layer 661 of FIG. 4. In subsequent step 308 corresponding to step 662 of FIG. 4, layer 661 is subjected to natural oxidation as has already been described in connection with step 662 of FIG. 4. Following natural oxidation step 308, then naturally oxidized layer 661 is subjected to rapid oxidation step 310 as has been described in connection with steps 464 of FIG. 2 and 564 of FIG. 3. It is desirable that rapid oxidation step 310 be performed long enough to substantially convert most of the remainder of layer 661 to insulating oxide. The combination of oxidation steps 308, 310 forms insulating layer 37 of M-I-M sandwich 32 of MTJ 31 of FIG. 1, on which in step 312, ferro-magnetic layer 38 of, for example NiFe or other ferro-magnetic alloys, is deposited or otherwise formed, in such a way that magnetization direction 42 can be modified relative to magnetization direction 40 of layer 36. The present invention does not depend upon the exact means by which layer 38 is formed, so long as it is a conductive electrode for carrying tunneling current $I_t$ passing through thin insulating layer 37. After step 312, M-I-M structure 32 of MTJ 31 is substantially complete and method 300 generally goes to END 314.

Referring now to FIGS. 5 and 10, method 400 of FIG. 10 begins with START 402 and initial step 404 analogous to step 104 of method 100, wherein fixed spin alignment ferro-magnetic magnetic layer 36 is formed by any convenient technique, as has already been described in connection with step 104. In step 406, first oxidizable metal layer 761 is deposited as described in connection with layer 761 of FIG. 5 and to thickness in the range already described for layer 761. In subsequent first natural oxidation step 408 corresponding to step 762-1 of FIG. 5, layer 761 is subjected to first natural oxidation as described in connection with step 762-1 of FIG. 5. Following first natural oxidation step 408, then in step 410 second oxidizable metal layer 763 is deposited or otherwise formed over partially oxidized layer 761, as already described in connection with layer 763 of FIG. 5. Following step 410, then in step 412 analogous to step 762-2 of FIG. 5, layer 763 is subjected to second natural oxidation step 412 as has already been described in connection with step 762-2 of FIG. 5. Following second natural oxidation step 412, then rapid oxidation step 414 analogous to steps 564 of FIG. 3 and/or 764 of FIG. 5 is performed. It is desirable that rapid oxidation step 414 be performed long enough to substantially convert the un-oxidized remainder of layer 763 to insulating oxide. It also contributes to further conversion of unoxidized material of layer 761 to insulating oxide. The combination of oxidation steps 408, 412 and 414 forms insulating layer 37 of M-I-M sandwich 32 of MTJ 31 of FIG. 1, on which in step 416, ferro-magnetic layer 38 of, for example NiFe or other ferro-magnetic alloys, is deposited or otherwise formed, in such a way that magnetization direction 42 can be modified relative to magnetization direction 40 of layer 36. The present invention does not depend upon the exact means by which layer 38 is formed, so long as it is a conductive electrode for carrying tunneling current $I_t$ passing through thin insulating layer 37. After step 416, M-I-M structure 32 of MTJ 31 is substantially complete and method 400 generally goes to END 418.

According to a first embodiment, there is provided a method for forming an array of magnetic tunnel junction (MTJ) devices, comprising, providing a first ferro-magnetic electrode, depositing a first layer of a first oxidizable material of a first thickness on the first electrode, exposing the first layer of a first oxidizable material to a natural oxidation process to convert at least part of the first oxidizable material to a first insulating oxide portion, exposing the first insulating oxide portion to a further rapid oxidation process providing substantially accelerated oxidation compared to the natural oxidation process, so as to convert at least part of a remaining portion of the first layer of first oxidizable material to a second insulating oxide portion contiguous with the first insulating oxide portion whereby the combination of the first and second insulating oxide portions forms an insulating layer on the first ferro-magnetic electrode, and providing a second ferro-magnetic electrode on the insulating layer. According t a further embodiment, the oxidizable material comprises one or more of Al, Mg, Zr, Ti, Hf, Ta or combinations thereof. According to a still further embodiment, the oxidizable material comprises aluminum. According to a yet further embodiment, the first thickness is in the range of 5 to 15 Angstrom units. According to a still yet further embodiment, the rapid oxidation process proceeds at least twice as fast as the natural oxidation process. According to a yet still further embodiment, the natural oxidation process comprises exposing the first oxidizable material to an oxygen bearing gas at a pressure in the range of 0.15-10 milli-Torr for a time in the range of 100-2000 seconds at a temperature less than about 35° C. According to an additional embodiment, the rapid oxidation process comprises plasma oxidation.

According to a second embodiment, there is provided a method for forming an array of magnetic tunnel junction (MTJ) devices, comprising, providing a first ferro-magnetic electrode, depositing a first layer of a first oxidizable material of a first thickness on the first electrode, exposing the first layer of first oxidizable material to a first natural oxidation process at a predetermined first pressure for a predetermined first time, to convert a portion of the first layer of first oxidizable material to a first insulating oxide, depositing a second layer of a second oxidizable material of a second thickness on the first insulating oxide, exposing the second layer of second oxidizable material to a further rapid oxidation process providing substantially accelerated oxidation compared to the first natural oxidation process, so as to convert at least the second layer of second oxidizable material to a further insulating oxide contiguous with the first insulating oxide, and providing a second ferro-magnetic electrode on the further insulating oxide. According to a further embodiment, the first and second oxidizable materials comprise one or more of Al, Mg, Zr, Ti, Hf, Ta or combinations thereof. According to a still further embodiment, the first thickness comprises approximately 50-60% of the sum of the first and second thicknesses. According to a yet further embodiment, the first thickness comprises approximately 65-85% of the sum of the first and second thicknesses. According to a still yet further embodiment, the first pressure is in a range of less than about 0.05 milli-Torr and the first time is about 10-30 seconds. According to a yet still further embodiment, the first pressure is in the range of about 0.15-10 milli-Torr and the first time is in the range of about 100-2000 seconds. According to an additional embodiment, the method further comprises before the step of exposing the second layer of second oxidizable material to a further rapid oxidation process, exposing the second layer of second oxidizable material to a second natural oxidation process at a predetermined second pressure for a predetermined second time. According to a yet another embodiment, the rapid oxidation process comprises plasma oxidation.

According to a third embodiment, there is provided a method for forming a metal-insulating-metal tunneling structure of a magnetic tunnel junction device, comprising, providing a first ferro-magnetic electrode, depositing a first layer of a first oxidizable material of a first thickness on the first electrode, first exposing the first layer of the first oxidizable material to a natural oxidation process to convert a part of the first layer of first oxidizable material to a first insulating oxide portion, second exposing the first insulating oxide portion to a further rapid oxidation process providing substantially accelerated oxidation compared to the natural oxidation process, so as to convert some or all of the remaining oxidizable material to a second insulating oxide portion contiguous with the first insulating oxide portion whereby the combination of the first and second insulating oxide portions forms an insulating layer on the first ferro-magnetic electrode, and providing a second ferro-magnetic electrode on the insulating layer to form the metal-insulator-metal tunneling structure of the magnetic tunnel junction device. According to a further embodiment, the oxidizable material comprises one or more of Al, Mg, Zr, Ti, Hf, Ta or combinations thereof. According to a still further embodiment, the method further comprises prior to the second exposing step, forming a second layer of a second oxidizable material of a second thickness on the first insulating oxide portion. According to a yet further embodiment, the natural oxidation process comprises exposing the first oxidizable material to an oxygen bearing gas at a pressure in the range of 0.15-10 milli-Torr for a time in the range of 100-2000 seconds at a temperature less than about 35° C. According to a still yet further embodiment, the rapid oxidation process comprises plasma oxidation.

While at least one exemplary embodiment has been presented in the foregoing detailed description, it should be appreciated that a vast number of variations exist. For example, and not intended to be limiting, while it is preferred that the first and second oxidizable layers (e.g., layers 461, 463; 561, 563; and 761, 763) be of the same material, this is not essential and different oxidizable materials may be used in the different layers depending upon the desired device properties. In addition, while the base process natural oxidation uses pressures of 0.03-0.05 milli-Torr for times of 10-30 seconds and the improved processes natural oxidation uses pressures of 0.15 to 10 milli-Torr for times of 100-2000 seconds, intermediate pressures and times can also be usefully employed for natural oxidation, for example, pressures in the range 0.05 to 0.15 milli-Torr and times in the range of 10-100 seconds. Stated another way, natural oxidation in the pressure range of about 0.03 to 10 milli-Torr for times of 10 to 2000 seconds are useful. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for forming an array of magnetic tunnel junction (MTJ) devices, comprising:
   providing a first ferro-magnetic electrode and a second ferro-magnetic electrode;
   forming an insulating layer between the first and second ferro-magnetic electrodes, comprising:
   depositing a layer of an oxidizable material of a first thickness on the first electrode;
   exposing the layer of the oxidizable material to a natural oxidation process to convert at least part of the oxidizable material to an insulating oxide portion; and
   subsequent to exposing the layer of the oxidizable material to a natural oxidation process, exposing the insulating oxide portion to a further rapid oxidation process providing substantially accelerated oxidation compared to the natural oxidation process, so as to convert at least part of a remaining portion of the layer of the oxidizable material and the insulating oxide portion to the insulating layer on the first ferro-magnetic electrode;
   wherein the second ferro-magnetic electrode is formed on the insulating layer.

2. The method of claim 1, wherein the oxidizable material comprises one or more of Al, Mg, Zr, Ti, Hf, Ta or combinations thereof.

3. The method of claim 1, wherein the oxidizable material comprises aluminum.

4. The method of claim 3, wherein the first thickness is in the range of 5 to 15 Angstrom units.

5. The method of claim 3, wherein the further rapid oxidation process proceeds at least twice as fast as the natural oxidation process.

6. The method of claim 1, wherein the natural oxidation process comprises exposing the oxidizable material to an oxygen bearing gas at a pressure in the range of 0.15-10 milli-Torr for a time in the range of 100-2000 seconds at a temperature less than about 35° C.

7. The method of claim 1, wherein the further rapid oxidation process comprises plasma oxidation.

8. A method for forming an array of magnetic tunnel junction (MTJ) devices, comprising:
   providing a first ferro-magnetic electrode and a second ferro-magnetic electrode;
   forming an insulating layer between the first and second ferro-magnetic electrodes, comprising:
      depositing a first layer of a first oxidizable material of a first thickness on the first electrode;
      exposing the first layer of the first oxidizable material to a first natural oxidation process at a predetermined first pressure for a predetermined first time, to convert a portion of the first layer of first oxidizable material to a first insulating oxide;
      depositing a second layer of a second oxidizable material of a second thickness on the first insulating oxide; and
      exposing the second layer of the second oxidizable material to a further rapid oxidation process providing substantially accelerated oxidation compared to the first natural oxidation process, so as to convert at least the second layer of the second oxidizable material to a second insulating oxide contiguous with the first insulating oxide, and to convert a remaining portion of the first oxidizable material to the first insulating oxide, the first and the second insulating oxides forming the insulating layer;
   wherein the second ferro-magnetic electrode is disposed on the second insulating oxide.

9. The method of claim 8, wherein the first and second oxidizable materials comprise one or more of Al, Mg, Zr, Ti, Hf, Ta or combinations thereof.

10. The method of claim 8, wherein the first thickness comprises approximately 50-60% of the sum of the first and second thicknesses.

11. The method of claim 8, wherein the first thickness comprises approximately 65-85% of the sum of the first and second thicknesses.

12. The method of claim 8, wherein the predetermined first pressure is in a range of less than about 0.05 milli-Torr and the predetermined first time is about 10-30 seconds.

13. The method of claim 8, wherein the predetermined first pressure is in the range of about 0.15-10 milli-Torr and the predetermined first time is in the range of about 100-2000 seconds.

14. The method of claim 13, further comprising before the step of exposing the second layer of the second oxidizable material to the further rapid oxidation process, exposing the second layer of the second oxidizable material to a second natural oxidation process at a predetermined second pressure for a predetermined second time.

15. The method of claim 8 wherein the further rapid oxidation process comprises plasma oxidation.

16. A method for forming a metal-insulating-metal tunneling structure of a magnetic tunnel junction device, comprising:
   providing a first ferro-magnetic electrode and a second ferro-magnetic electrode;
   forming an insulating layer between the first and second ferro-magnetic electrodes, comprising:
      depositing a first layer of a first oxidizable material of a first thickness on the first electrode;
      first, exposing the first layer of the first oxidizable material to a natural oxidation process to convert a part of the first layer of the first oxidizable material to a first insulating oxide portion; and
      second, exposing the first insulating oxide portion to a further rapid oxidation process providing substantially accelerated oxidation compared to the natural oxidation process, so as to convert some or all of a remaining portion of the first oxidizable material and the first insulating oxide portion to the insulating layer on the first ferro-magnetic electrode;
   wherein the second ferro-magnetic electrode is positioned on the insulating layer to form the metal-insulator-metal tunneling structure of the magnetic tunnel junction device.

17. The method of claim 16, wherein the first oxidizable material comprises one or more of Al, Mg, Zr, Ti, Hf, Ta or combinations thereof.

18. The method of claim 16, further comprising prior to the further rapid oxidation:
   forming a second layer of a second oxidizable material of a second thickness on the first insulating oxide portion.

19. The method of claim 16, wherein the natural oxidation process comprises exposing the first oxidizable material to an oxygen bearing gas at a pressure in the range of 0.03-10 milli-Torr for a time in the range of 10-2000 seconds at a temperature less than about 35° C.

20. The method of claim 16, wherein the further rapid oxidation process comprises plasma oxidation.

* * * * *

UNITED STATES PATENT AND TRADEMARK OFFICE
CERTIFICATE OF CORRECTION

PATENT NO. : 7,635,654 B2
APPLICATION NO. : 11/341986
DATED : December 22, 2009
INVENTOR(S) : Sun et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 598 days.

Signed and Sealed this

Ninth Day of November, 2010

David J. Kappos
*Director of the United States Patent and Trademark Office*